United States Patent
Sotojima et al.

(10) Patent No.: US 6,904,702 B2
(45) Date of Patent: Jun. 14, 2005

(54) METHOD AND APPARATUS FOR DRYING SUBSTRATE

(75) Inventors: Takazo Sotojima, Osaka (JP); Norio Maeda, Nara (JP)

(73) Assignees: Toho Kasei, Ltd, Nara (JP); Daikin Industries, Ltd., Osaka (JP)

( * ) Notice: Subject to any disclaimer, the term of this patent is extended or adjusted under 35 U.S.C. 154(b) by 0 days.

(21) Appl. No.: 10/438,002

(22) Filed: May 15, 2003

(65) Prior Publication Data

US 2004/0031168 A1 Feb. 19, 2004

(51) Int. Cl.$^7$ ................................................. F26B 3/00
(52) U.S. Cl. ............................ 34/467; 34/468; 34/469; 34/72; 34/73; 34/74; 134/95.2
(58) Field of Search .......................... 34/448, 467, 468, 34/469, 470, 72, 73, 74, 75, 76, 77, 78; 134/95.2

(56) References Cited

U.S. PATENT DOCUMENTS

| | | | |
|---|---|---|---|
| 4,967,777 A | | 11/1990 | Takayama et al. |
| 4,984,597 A | * | 1/1991 | McConnell et al. ........ 134/95.2 |
| 5,071,488 A | | 12/1991 | Takayama et al. |
| 5,236,515 A | | 8/1993 | Ueno et al. |
| 5,369,891 A | * | 12/1994 | Kamikawa ..................... 34/78 |
| 5,520,744 A | | 5/1996 | Fujikawa et al. |
| 5,634,978 A | | 6/1997 | Mohindra et al. |
| 5,653,045 A | | 8/1997 | Ferrell |
| 5,685,086 A | | 11/1997 | Ferrell |
| 5,715,612 A | * | 2/1998 | Schwenkler ................. 34/470 |
| 5,782,990 A | | 7/1998 | Murakami et al. |
| 5,913,981 A | | 6/1999 | Florez |
| 5,951,779 A | | 9/1999 | Koyanagi et al. |
| 5,954,911 A | | 9/1999 | Bergman et al. |

(Continued)

FOREIGN PATENT DOCUMENTS

| | | |
|---|---|---|
| JP | 63301528 A | 12/1988 |
| JP | 01022256 A | 1/1989 |
| JP | 2-46727 | 2/1990 |
| JP | 04349626 A | 12/1992 |
| JP | 5-36668 | 2/1993 |
| JP | 06103686 A | 4/1994 |
| JP | 06181198 A | 6/1994 |
| JP | 08141526 A | 6/1996 |
| JP | 09275084 | 7/1997 |
| JP | 09213672 A | 8/1997 |
| JP | 10189517 A | 7/1998 |
| JP | 10308378 A | 11/1998 |
| JP | 10335299 A | 12/1998 |
| JP | 11176796 A | 7/1999 |
| JP | 11211345 A | 8/1999 |
| JP | 11307504 A | 11/1999 |
| JP | 11345798 A | 12/1999 |
| JP | 2000-012505 | 1/2000 |
| WO | WO 97/33702 | 9/1997 |
| WO | WO 97/44710 | 11/1997 |

*Primary Examiner*—Jiping Lu
(74) *Attorney, Agent, or Firm*—Birch, Stewart, Kolasch & Birch, LLP

(57) ABSTRACT

The substrate drying apparatus has a substrate processing vessel 1, a substrate supporting section for supporting plural substrates 2 in a standing condition and lined up condition in the interior of the substrate processing vessel 1, fluid reservoir section 3 for drying provided at an upward predetermined position of the substrate processing vessel 1, a first inert gas supplying section 4 for blowing inert gas against the drying fluid 6 pooled in the fluid reservoir section 3 for drying so as to generate droplet of the drying fluid, and for guiding the droplet towards the center of the substrate processing vessel 1, and a second inert gas supplying section 5 for supplying inert gas vertically and downwardly so as to supply the generated droplet of the drying fluid towards the substrates 2, consequently safety is improved without providing special safety device, and sufficient amount of drying fluid is supplied to the dipping boundary face of the substrate and the cleaning liquid.

14 Claims, 6 Drawing Sheets

U.S. PATENT DOCUMENTS

| | | | |
|---|---|---|---|
| 5,964,958 A | 10/1999 | Ferrell et al. | |
| 5,968,285 A | 10/1999 | Ferrell et al. | |
| 6,123,900 A | 9/2000 | Vellutato | |
| 6,134,807 A * | 10/2000 | Komino et al. | 34/418 |
| 6,152,153 A | 11/2000 | Takase et al. | |
| 6,216,709 B1 | 4/2001 | Fung et al. | |
| 6,247,479 B1 * | 6/2001 | Taniyama et al. | 134/95.2 |
| 6,328,814 B1 | 12/2001 | Fishkin et al. | |
| 6,412,501 B1 | 7/2002 | Onoda et al. | |
| 6,491,045 B2 | 12/2002 | Kamikawa et al. | |
| 6,589,386 B1 | 7/2003 | Maeda et al. | |

* cited by examiner

Affection of Teflon sheet

METHOD AND APPARATUS FOR DRYING SUBSTRATE

TECHNICAL FIELD

The present invention relates to a method and apparatus for drying substrate. More particularly, the present invention relates to a method and apparatus for drying substrate rapidly, the substrate being cleaned using cleaning liquid. In this specification, the phrase "cleaning using cleaning liquid" is used as concept which includes not only cleaning using cleaning liquid but also rinsing with pure water (includes only rinsing with pure water).

RELATED ART

From the past, enlarging in diameter of substrate objected for processing has advanced, shifting from 8 inches wafer to 12 inches wafer is performed. And, following in enlarging in diameter of wafer, decreasing wafer pitch to half pitch with respect to the conventional wafer pitch is advancing.

Consequently, sufficient amount of drying fluid cannot be supplied to the dipping boundary face of substrates and cleaning liquid, good Marangoni drying becomes very difficult to be achieved.

To dissolve such disadvantage, following methods are proposed from the past:
(1) carrying out bubbling for the drying fluid with inert gas, and introducing the mixture gas of the inert gas and the drying fluid into a vessel for processing substrates; and
(2) forming droplet of drying fluid using ultrasonic wave or the like, then introducing the droplet into a vessel for processing substrates by using inert gas as carrier gas {refer to Tokukaihei 10-335299 (Japanese Patent Laid-Open Gazette No. 335299/1998)}.

Further, it is also proposed to use isopropyl alcohol (hereinafter, referred to as IPA) as drying fluid, and to use flon as drying fluid {refer to Tokukaishou 63-301528 (Japanese Patent Laid-Open Gazette No. 301528/1988)}.

For supplying sufficient amount of drying fluid to the dipping boundary face of substrates and cleaning liquid by employing the method (1), it is necessary that the inert gas and drying fluid are increased their temperature to high temperature. Therefore, disadvantages arise in that ensuring safety of substrate drying system becomes difficult, and that cost becomes expensive cost. Especially, when IPA is employed as drying fluid, large scale apparatus must be provided to ensure safety because IPA has high inflammability.

When the method (2) is employed, ultrasonic wave generation apparatus and the like become necessary. Therefore, not only increase in cost is realized but also reliability is lowered.

The present invention was made in view of the above problems.

It is an object of the present invention to offer a method and apparatus for drying substrate which improve safety without special safety apparatus, and which supply sufficient amount of drying fluid to dipping boundary face of substrates and cleaning liquid.

SUMMARY OF THE INVENTION

A method for drying substrate of an exemplary embodiment is a method which reservoirs drying fluid at an upper section within a processing vessel, generates droplet of drying fluid and guides the droplet in a direction coming close to one another within the processing vessel by blowing inert gas against the reservoir drying fluid, and supplies inert gas so as to guide the generated droplet of drying fluid to surface of each substrate, the droplet being guided in the direction coming close to one another, when plural substrates are housed within the processing vessel in a lined up manner, and when the surface of the substrate is dried by relatively descending the liquid surface within the processing vessel with respect to the substrate and by supplying the drying fluid to the surface of the substrate during the descending operation.

A method for drying substrate of another exemplary embodiment is a method which employs isopropyl alcohol as the drying fluid.

A method for drying substrate of another exemplary embodiment is a method which employs nitrogen gas as the inert gas.

An apparatus for drying substrate of an exemplary embodiment is an apparatus which houses a plurality of substrate within the processing vessel in a lined up manner, and dries the surface of the substrate by relatively descending the liquid surface within the processing vessel with respect to the substrate and by supplying the drying fluid to the surface of the substrate during the descending operation, the apparatus comprises drying fluid reservoir means for pooling drying fluid at an upper section within a processing vessel, first inert gas supplying means for generating droplet of drying fluid and guiding the droplet in a direction coming close to one another within the processing vessel by blowing inert gas against the reservoir drying fluid, and second inert gas supplying means for supplying inert gas so as to guide the generated droplet of drying fluid to surface of each substrate, the droplet being guided in the direction coming close to one another.

An apparatus for drying substrate of another exemplary embodiment is an apparatus which employs isopropyl alcohol as the drying fluid.

An apparatus for drying substrate of another exemplary embodiment is an apparatus which employs drying fluid reservoir means having a drying fluid reservoir concave which is elongated in parallel to a row direction of plural substrates, and which is opened its top, as the drying fluid reservoir means.

An apparatus for drying substrate of another exemplary embodiment is an apparatus which employs an inert gas supplying means having an inert gas exhaust opening for exhausting inert gas in vertical and downward, as the second inert gas supplying means.

An apparatus for drying substrate of another exemplary embodiment is an apparatus which employs an inert gas exhaust opening having a length equal to or longer than a diameter thereof, as the inert gas exhaust opening.

An apparatus for drying substrate of another exemplary embodiment is an apparatus which employs an inert gas supplying means having a predetermined run-up section between the inert gas supply opening and the inert gas exhaust section, as the second inert gas supplying means.

An apparatus for drying substrate of another exemplary embodiment is an apparatus which employs an inert gas supplying means having an inert gas introduction space, an inert gas exhaust section, and a porous body disposed between the inert gas introduction space and the inert gas exhaust section, as the second inert gas supplying means.

An apparatus for drying substrate of another exemplary embodiment is an apparatus further comprising a space for inert gas exhausting which is disposed between the porous body and the inert gas exhaust section.

An apparatus for drying substrate another exemplary embodiment is an apparatus which employs a pair of first spaces extending in parallel to all inert gas exhaust sections as the inert gas introduction section, a second space communicated to an inner end of the inert gas exhaust section as the space for inert gas exhausting, and porous bodies each provided between each first space and the second space as the porous body.

An apparatus for drying substrate of another exemplary embodiment is an apparatus which employs polytetrafluoroethylene sheet as the porous body.

An apparatus for drying substrate of another exemplary embodiment is an apparatus which determines the interval between the inert exhaust openings to be whole number times of the interval between the substrates objected for drying, and provides an inert gas exhaust opening corresponding to the out side of the substrate which is disposed at the most edge section, and determines the interval between this inert gas exhaust opening and the inert gas exhaust opening to be equal to the interval between the substrates.

When the method for drying substrate of an exemplary embodiment is employed, when plural substrates are housed within the processing vessel in a lined up manner, and when the surface of the substrate is dried by relatively descending the liquid surface within the processing vessel with respect to the substrate and by supplying the drying fluid to the surface of the substrate during the descending operation, the method reservoirs drying fluid at an upper section within a processing vessel, generates droplet of drying fluid and guides the droplet in a direction coming close to one another within the processing vessel by blowing inert gas against the reservoir drying fluid, and supplies inert gas so as to guide the generated droplet of drying fluid to surface of each substrate, the droplet being guided in the direction coming close to one another. Therefore, neither the inert gas nor the drying fluid is needed to be at high temperature so that safety is improved and that sufficient amount of drying fluid is supplied to the dipping boundary face of the substrate and the cleaning liquid so as to realize rapid drying with high quality. Further, reliability and durability are improved because ultrasonic wave generation apparatus and the like are not needed.

When the method for drying substrate of another exemplary embodiment is employed, the method employs isopropyl alcohol as the drying fluid. Therefore Marangoni drying with low cost and with high quality is realized.

When the method for drying substrate of another exemplary embodiment is employed, the method employs nitrogen gas as the inert gas.

When the apparatus for drying substrate of an exemplary embodiment is employed, and when the apparatus houses a plurality of substrate within the processing vessel in a lined up manner, and dries the surface of the substrate by relatively descending the liquid surface within the processing vessel with respect to the substrate and by supplying the drying fluid to the surface of the substrate during the descending operation, the apparatus pools the drying fluid at an upper section within a processing vessel by the drying fluid reservoir means, generates droplet of drying fluid and guides the droplet in a direction coming close to one another within the processing vessel by blowing inert gas against the reservoir drying fluid by the first inert gas supplying means, and supplies inert gas so as to guide the generated droplet of drying fluid to surface of each substrate by the second inert gas supplying means, the droplet being guided in the direction coming close to one another.

Therefore, neither the inert gas nor the drying fluid is needed to be at high temperature so that safety is improved and that sufficient amount of drying fluid is supplied to the dipping boundary face of the substrate and the cleaning liquid so as to realize rapid drying with high quality. Further, reliability and durability are improved because ultrasonic wave generation apparatus and the like are not needed.

When the apparatus for drying substrate of another exemplary embodiment is employed, the apparatus employs isopropyl alcohol as the drying fluid. Therefore Marangoni drying with low cost and with high quality is realized.

When the apparatus for drying substrate of another exemplary embodiment is employed, the apparatus employs drying fluid reservoir means having a drying fluid reservoir concave which is elongated in parallel to a row direction of plural substrates, and which is opened its top, as the drying fluid reservoir means.

When the apparatus for drying substrate of another exemplary embodiment is employed, the apparatus employs an inert gas supplying means having an inert gas exhaust opening for exhausting inert gas in vertical and downward, as the second inert gas supplying means. Therefore, uneven drying within surface of each substrate is greatly suppressed.

When the apparatus for drying substrate of another exemplary embodiment is employed, the apparatus employs an inert gas exhaust opening having a length equal to or longer than a diameter thereof, as the inert gas exhaust opening. Therefore, progressiveness of the inert gas is improved.

When the apparatus for drying substrate of another exemplary embodiment is employed, the apparatus employs an inert gas supplying means having a predetermined run-up section between the inert gas supply opening and the inert gas exhaust section, as the second inert gas supply means. Therefore, uneven drying among plural substrates are greatly suppressed.

When the apparatus for drying substrate of another exemplary embodiment is employed, the apparatus employs an inert gas supplying means having an inert gas introduction space, an inert gas exhaust section, and a porous body disposed between the inert gas introduction space and the inert gas exhaust section, as the second inert, gas supplying means. Therefore, uneven drying among plural substrates are greatly suppressed.

When the apparatus for drying substrate of another exemplary embodiment is employed, the apparatus further comprises a space for inert gas exhausting which is disposed between the porous body and the inert gas exhaust section. Therefore, uneven drying among plural substrates are greatly suppressed.

When the apparatus for drying substrate of another exemplary embodiment is employed, the apparatus employs a pair of first spaces extending in parallel to all inert gas exhaust sections as the inert gas introduction section, a second space communicated to an inner end of the inert gas exhaust section as the space for inert gas exhausting, and porous bodies each provided between each first space and the second space as the porous body. Therefore, the second inert gas supplying means is decreased in size.

When the apparatus for drying substrate of another exemplary embodiment is employed, the apparatus employs polytetrafluoroethylene sheet as the porous body.

When the apparatus for drying substrate of another exemplary embodiment is employed, the apparatus determines the interval between the inert gas exhaust openings to be whole number times of the interval between the substrates objected for drying, and Provides an inert gas exhaust opening corresponding to the out side of the substrate which is disposed at the most edge section, and determines the interval between this inert gas exhaust opening and the inert gas exhaust opening to be equal to the interval between the substrates. Therefore, uneven drying among plural substrates are greatly suppressed.

DETAILED DESCRIPTION OF THE INVENTION

Hereinafter, referring to the accompanying drawings, we explain a method and apparatus for drying substrate of an embodiment according to the present invention in detail.

Figure 1:
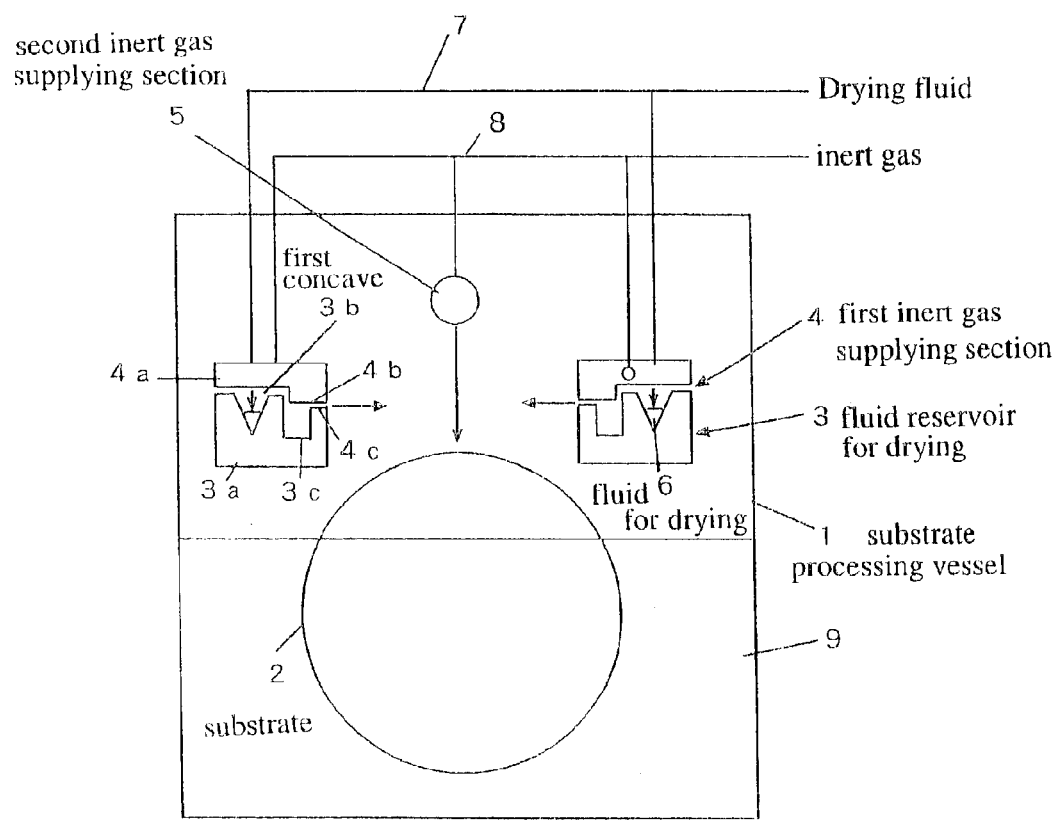
FIG. 1 is a schematic front view illustrating a substrate drying apparatus of an embodiment according to the present invention.
Figure 2:
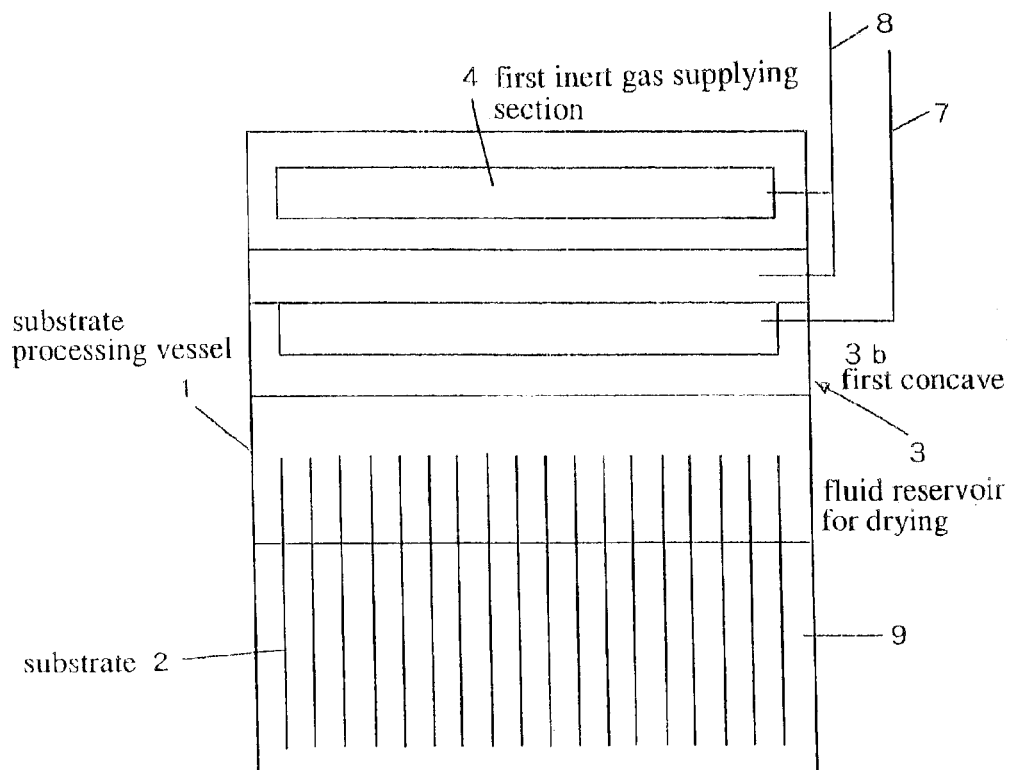
FIG. 2 is a schematic side view of the same.

FIG. 1 is a schematic front view of a substrate drying apparatus of an embodiment according to the present invention, while FIG. 2 is a schematic side view of the same.

This substrate drying apparatus has a substrate processing vessel 1, a substrate supporting section (not illustrated) for supporting plural substrates (for example, semiconductor wafers) 2 in a standing condition and lined up condition in the interior of the substrate processing vessel 1, fluid reservoir section 3 for drying provided at an upward predetermined position of the substrate processing vessel 1, a first inert gas supplying section 4 for blowing inert gas (for example, nitrogen gas) against the drying fluid 6 pooled in the fluid reservoir section 3 for drying so as to generate droplet of the drying fluid, and for guiding the droplet towards the center of the substrate processing vessel 1, and a second inert gas supplying section 5 for supplying inert gas vertically and downwardly so as to supply the generated droplet of the drying fluid towards the substrates 2. Further, reference numeral 7 designates a drying fluid passage, reference numeral 8 designates an inert gas supplying passage for supplying inert gas to the first inert gas supplying section 4 and the second inert gas supplying section 5, and reference numeral 9 designates pure water.

In the substrate processing vessel 1, entire surface of each substrate 2 is cleaned by dipping all substrates 2 in cleaning liquid by supplying the cleaning liquid using a cleaning liquid supplying section (not illustrated), then all substrates 2 are rinsed with pure water 9 by substituting pure water 9 for cleaning liquid, then the pure water 9 is discharged through a cleaning liquid discharging section (not illustrated).

The substrate supporting section draws up plural substrates 2 in standing condition at every predetermined interval by engaging the plural substrates 2 at their peripheral predetermined positions.

The fluid reservoir section 3 for drying has a main body member 3a elongating in parallel to an imaginary central axis which connects center of plural substrates 2, a first concave 3b for housing drying fluid elongating almost entire length of the main body member 3a, and a second concave 3c in parallel to the first concave 3b and is disposed at center-ward position of the substrate processing vessel 1 with respect to the first concave 3b. The fluid reservoir section 3 for drying is disposed obliquely and above with respect to the plural substrates 2. As the drying fluid, various drying fluid known from the past can be employed. But, it is preferable that IPA is employed as the drying fluid so that Marangoni drying can be realized.

The first inert gas supplying section 4 has a main body member 4a located at an upper section of, the fluid reservoir section 3 for drying, an inert gas exhaust opening (not illustrated) formed at opposition position with respect to the first concave 3b for exhausting inert gas downward, and a guide path forming section 4b for forming a guide path 4c towards the center of the substrate processing vessel 1 so as to guide very fine droplet of drying fluid to be scattered. The inert gas exhaust opening is determined its caliber, pitch, exhausting direction, and is determined exhausting initial speed of inert gas, so as to exhaust inert gas with high speed towards the surface of the drying fluid housed within the first concave 3b so that the drying fluid is scattered as very fine droplet from the surface of the drying fluid. The exhausting direction of the inert gas is not limited to a just beneath direction but may be obliquely and downwards direction.

The second inert gas supplying section 5 is a tube body disposed just above the plural substrates 2 with respect to the imaginary central axis, and is formed inert gas exhaust openings (not illustrated) for exhausting inert gas in a direction towards the substrate 2 (just beneath direction). It is preferable that a pitch of the inert gas exhaust openings is determined to be equal to the pitch of the substrates 2, or a pitch of the inert gas exhaust openings is determined to be one for integer, and that the inert gas exhaust opening is in correct position with respect to the space between substrates 2. It is preferable that the caliber of the inert gas exhausting opening is determined to be 1~5 mm. It is also preferable that the initial speed of the inert gas exhausted from the inert gas exhaust opening is determined to be 1~50 m/s. A tube body of one of various shapes such as circular cylinder shape, rectangular cylinder shape can be employed as the tube body.

Operation of the substrate drying apparatus having the above arrangement is as follows.

The surface of the plural substrates 2 is cleaned with cleaning liquid, the plural substrates 2 being supported within the substrate processing vessel 1 in standing condition and lined up condition. Then, the substrates 2 are rinsed with pure water 9 by substituting pure water 9 for cleaning liquid. Then, the surface of the substrates 2 are dried by the following operation with pure water 9 being discharged. But, there may be a case that only rinsing with pure water 9 is carried out without cleaning with cleaning liquid.

That is, very fine droplet of the drying fluid 6 is generated by blowing the inert gas against the liquid surface pooled in the first concave 3b of the fluid reservoir section 3 for drying, from the inert gas supplying passage 8 through the inert gas supplying section 4. Then, the droplet is exhausted together with the inert gas towards the center of the substrate processing vessel 1 through the guide path 4c.

And, by exhausting the inert gas into gaps between the substrates 2 from the inert gas supplying passage 8 through the second inert gas supplying section 5, droplet of the drying fluid exhausted from the guide path 4c, is drawn and is guided into the gaps between the substrates 2 so that sufficient amount of drying fluid is supplied to the dipping boundary face of the substrates 2 and the pure water 9. As a result, substrate drying is realized by the supplied drying fluid so that the surface of the substrate 2 is dried rapidly with high quality.

A thickness h0 of the water screen remaining on the surface of the substrate 2 which is relatively pulled up with respect to the pure water 9, is represented with the following equation of $$h0=0.944[(\eta V0)^{2/3}/v^{1/6}(\rho g)^{1/2}]$$

when viscosity of the liquid is supposed to be $\eta$, pulling up speed is supposed to be V0, surface tension is supposed to be v, density is supposed to be $\rho$, and gravitational acceleration is supposed to be g. It can be thought that when the drying condition is good, the remaining water screen amount h0 becomes to be a small value, and that drying is carried out perfectly when the remaining water screen amount h0 becomes to be 0. Therefore, the surface of the substrate 2 can be dried rapidly with high quality, as is described above.

Figure 3:
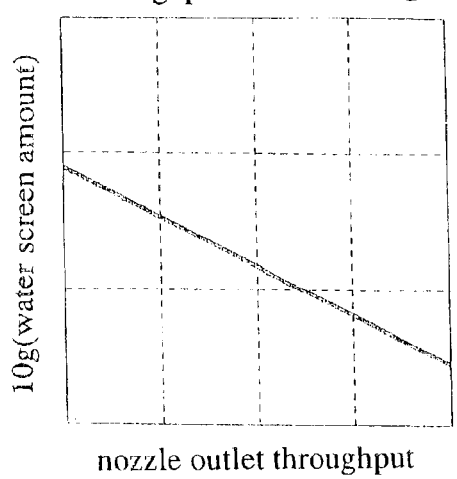
FIG. 3 is a diagram illustrating a relationship between the flowing velocity at the nozzle outlet and the remaining water screen amount of a second inert gas supplying section.

FIG. 3 is a diagram illustrating a relationship between the flowing velocity at the nozzle outlet and the remaining water screen amount of a second inert gas supplying section. It is understood from FIG. 3 that the remaining water screen amount is decreased following the increase in the flowing velocity at the nozzle outlet.

Even when the interval between the substrates 2 is determined to be half of the interval which is the interval between the substrates 2 when they are housed within a cassette for carrying the substrate, drying fluid is rapidly introduced using droplet of the drying fluid so that supplying the sufficient amount of drying fluid is realized.

As is understood from the foregoing description, raising the drying fluid 6 in its temperature is not needed at all so that safety is improved and that cost is decreased. Further, ultrasonic wave generation apparatus and the like are not needed at all so that reliability and durability are improved. Furthermore, consumption amount of the drying fluid can be decreased in comparison to that in a case where vapor of the drying fluid is employed, because droplet of the drying fluid is employed.

Especially, when IPA is employed as the drying fluid, the drying fluid itself has flammability. But, raising in temperature of the drying fluid is needed at all and usable amount of the drying fluid can be decreased so that safety is improved and that an equipment such as explosion proof can be made unnecessary.

Even when liquid drip is generated, this liquid drip is housed within the second concave 3c. Therefore, a disadvantage is prevented from occurrence that the liquid drip adheres to the substrate 2 so as to separate out metal and organic material.

Figure 4:
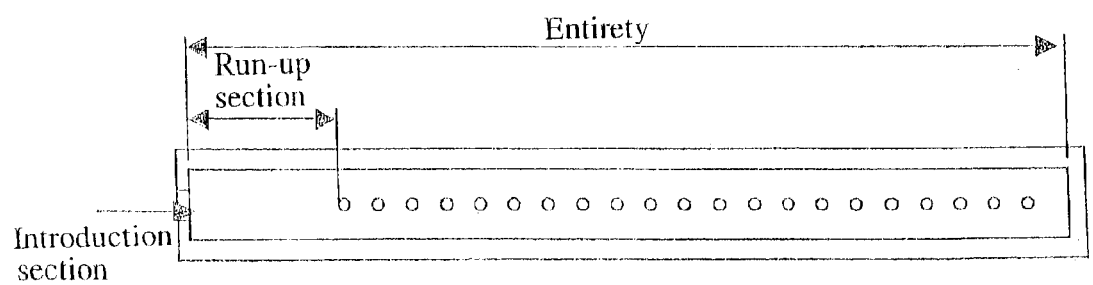
FIG. 4 is a horizontal cross sectional plane view illustrating a second inert gas supplying section of another arrangement.

FIG. 4 is a horizontal cross sectional plane view illustrating a second inert gas supplying section 5 of another arrangement.

This second inert gas supplying section 5 has a run-up section for a predetermined distance from the inert gas introduction section, and has inert gas exhaust openings only for an extent which is beyond the run-up section.

Figure 5:
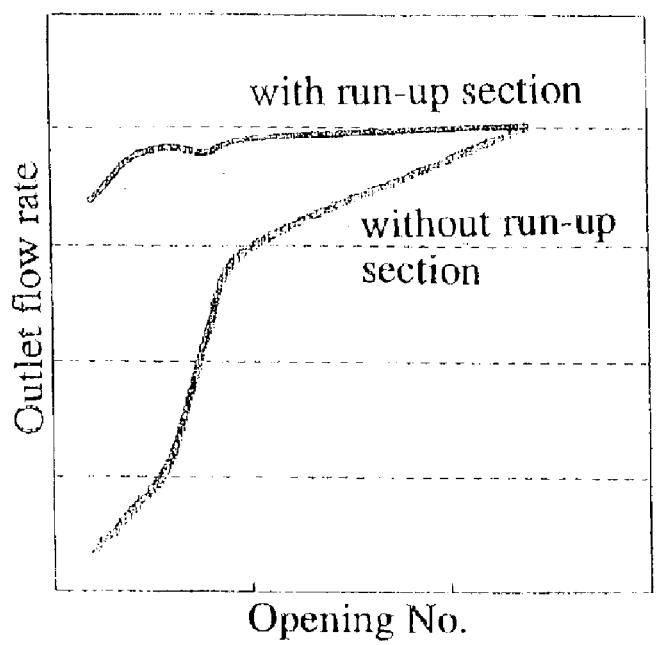
FIG. 5 is a diagram illustrating outlet velocity at each opening of the inert gas supplying section of FIG. 4, and outlet velocity at each exhaust opening of the inert gas supplying section which has no run-up section.

FIG. 5 is a diagram illustrating outlet velocity at each opening of the inert gas supplying section of FIG. 4, and outlet velocity at each exhaust opening of the inert gas supplying section which has no run-up section. It is understood from FIG. 5 that varying in outlet velocity can be suppressed by providing the run-up section.

As a result, unevenness in drying among plural substrates 2 is greatly suppressed.

Figure 6:
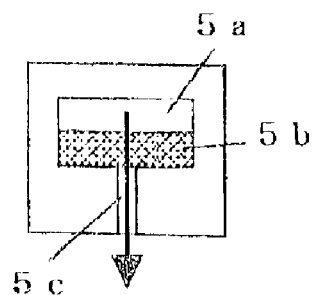
FIG. 6 is a vertical cross sectional view of a second inert gas supplying section of a further arrangement.

FIG. 6 is a vertical cross sectional view of a second inert gas supplying section 5 of a further arrangement.

This second inert gas supplying section 5 has a fluid introduction space 5a having a rectangular cross sectional shape and a porous body layer 5b provided at the bottom of the fluid introduction space 5a. The fluid introduction space 5a and the exhaust opening 5c are communicated to one another via the porous body layer 5b. Further, various porous bodies can be employed as the porous body. And, it is preferable that polytetrafluoro-ethylene sheet is employed as the porous body.

Figure 7:
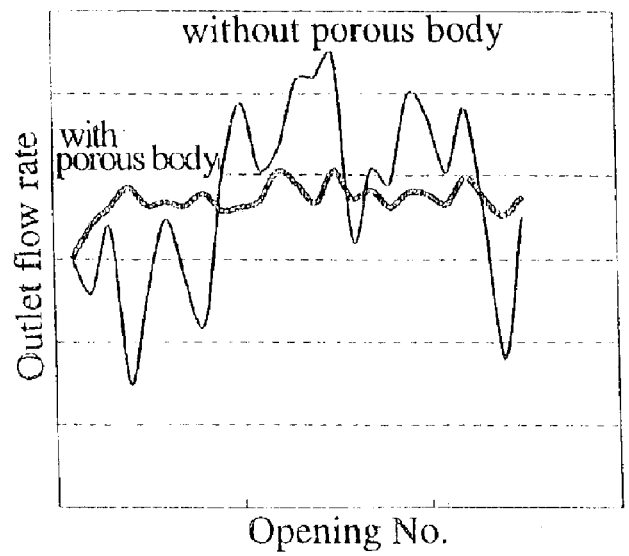
FIG. 7 is a diagram illustrating outlet velocity at each exhaust opening in a case that porous body layer is provided, and in a case that porous body layer is not provided.

FIG. 7 is a diagram illustrating outlet velocity at each exhaust opening in a case that porous body layer is provided, and in a case that porous body layer is not provided. It is understood from FIG. 7 that varying in outlet velocity can be suppressed by providing the porous body layer.

As a result, unevenness in drying among plural substrates 2 is greatly suppressed.

Figure 8:
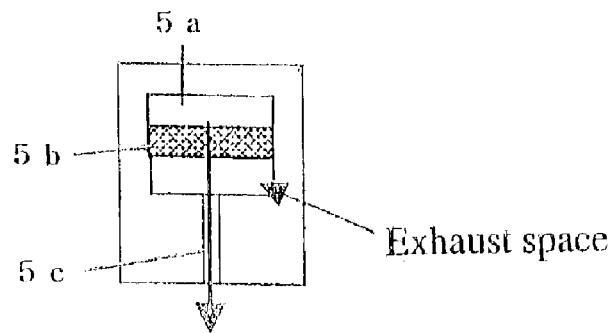
FIG. 8 is a vertical cross sectional view of a second inert gas supplying section of a further arrangement.

FIG. 8 is a vertical cross sectional view of a second inert gas supplying section 5 of a further arrangement.

This second inert gas supplying section 5 is different from the second inert gas supplying section 5 of FIG. 6 in that a fluid introduction space and an exhaust space are formed by providing a porous body layer 5b at the central section of the fluid introduction space 5a having rectangular cross sectional shape, and that the exhaust space and the exhaust openings 5c are directly communicated to one another.

When this arrangement is employed, varying in outlet velocity can be suppressed more, and unevenness in drying among plural substrates 2 is suppressed more.

Figure 9:
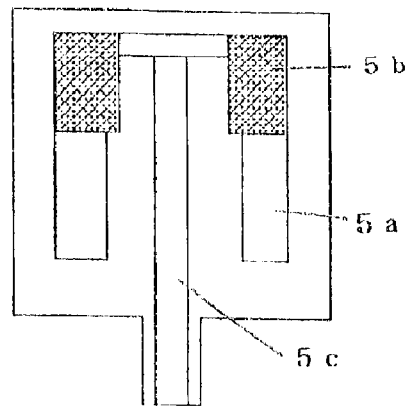
FIG. 9 is a vertical cross sectional view of a second inert gas supplying section of a further arrangement.

FIG. 9 is a vertical cross sectional view of a second inert gas supplying section of a further arrangement.

This second inert gas supplying section 5 is different from the second inert gas supplying section 5 of FIG. 8 in that the exhaust opening 5c is formed deep into the interior of the second inert gas supplying section main body, that a fluid introduction space 5a is formed extending in parallel to an imaginary plane connecting all exhaust openings 5c, that an exhaust space is formed which is communicated to the exhaust opening 5c in the deep interior section of the second inert gas supplying section main body and which crosses at right angles to the imaginary plane, and that each fluid introduction space 5a and the exhaust space are communicated to one another via the porous body layer 5b.

In this case, the second inert gas supplying section 5 can be decreased its size in comparison to a case where the exhaust space, porous body layer 5b and the fluid introduction space 5a are formed on an extension of the exhaust opening 5c.

Figure 10:
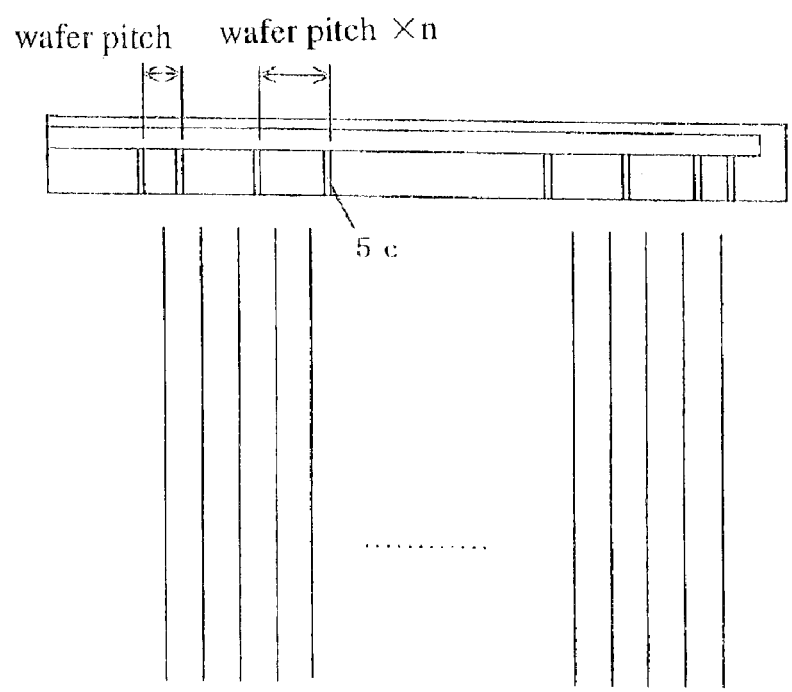
FIG. 10 is a diagram illustrating an exhaust opening pitch of a second inert gas supplying section and substrates together.

FIG. 10 is a diagram illustrating an exhaust opening pitch of a second inert gas supplying section and substrates together.

In FIG. 10, the exhaust opening opposites to the gap between the substrates, and a pitch of the exhaust openings is determined to be a pitch which is twice of the pitch of the substrates. And, the exhaust opening is formed at a pitch which is equal to the pitch of the substrates, in correspondence with the substrate at the most edge section.

FIG. 10 is preferable in a case that the substrates 2 are disposed in a mirror face opposition condition. Sufficient drying performance is achieved.

What is claimed is:

1. A method for drying substrate is a method which houses plural substrates within the processing vessel in a lined up manner, and which dries the surface of the substrate by relatively descending the liquid surface within the processing vessel with respect to the substrate and by supplying the drying fluid to the surface of the substrate during the descending operation, the method comprising the steps of:

pooling drying fluid at an upper section within a processing vessel; generating droplet of drying fluid and guides the droplet in a direction coming close to one anoth the processing vessel by blowing inert gas against the reservoir drying fluid, and supplying inert gas so as to guide the generated droplet of drying fluid to surface of each substrate, the droplet being guided in the direction toward the center of the proceesing vessel.

2. A method for drying substrate as set forth in claim 1, wherein isopropyl alcohol is employed as the drying fluid.

3. A method for drying substrate as set forth in claim 1 or claim 2, wherein nitrogen gas is employed as the inert gas.

4. An apparatus for drying substrate is an apparatus which houses plural substrates within the processing vessel in a lined up manner, and which dries the surface of the substrate by relatively descending the liquid surface within the processing vessel with respect to the substrate and by supplying the drying fluid to the surface of the substrate during the descending operation, the apparatus comprising:

drying fluid reservoir means for pooling drying fluid at an upper section within a processing vessel;

first inert gas supplying means for generating droplet of drying fluid and guiding the droplet in a direction toward the center of the processing vessel by blowing inert gas against the reservoir drying fluid; and second inert gas supplying means for supplying inert gas so as to guide the generated droplet of drying fluid to surface of each substrate, the droplet being guided in the direction toward the center of the processing vessel.

5. An apparatus for drying substrate as set forth in claim 4, wherein isopropyl alcohol is employed as the drying fluid.

6. An apparatus for drying substrate as set forth in claim 4 or claim 5, wherein the drying fluid reservoir means has a drying fluid reservoir concave which is elongated in parallel to a row direction of plural substrates, and which is opened its top.

7. An apparatus for drying substrate as set forth in claim 4 or claim 5, wherein the second inert gas supplying means has an inert gas exhaust opening for exhausting inert gas in vertical and downward.

8. An apparatus for drying substrate as set forth in claim 7, wherein the inert gas exhaust opening has a length which is equal to or longer than a diameter thereof.

9. An apparatus for drying substrate as set forth in claim 4, wherein the second inert gas supplying means has a predetermined run-up section between the inert gas supply opening and the inert gas exhaust section.

10. An apparatus for drying substrate as set forth in claim 4, wherein the inert gas supplying means has an inert gas introduction space, an inert gas exhaust section, and a porous body disposed between the inert gas introduction space and the inert gas exhaust section.

11. An apparatus for drying substrate as set forth in claim 10, further comprising a space for inert gas exhausting which is disposed between the porous body and the inert gas exhaust section.

12. An apparatus for drying substrate as set forth in claim 11, wherein the inert gas introduction section is a pair of first spaces extending in parallel to all inert gas exhaust sections, the space for inert gas exhausting is a second space communicated to an inner end of the inert gas exhaust section, and the porous body is provided between each first space and the second space as the porous body.

13. An apparatus for drying substrate as set forth in one of claims 10 to 12, wherein the porous body is polytetrafluoro-ethylene sheet.

14. An apparatus for drying substrate as set forth in claim 4, wherein the interval between the inert gas exhaust openings is determined to be whole number times of the interval between the substrates objected for drying, and an inert gas exhaust opening is provided corresponding to the out side of the substrate which is disposed at the most edge section, and the interval between this inert gas exhaust opening and the inert gas exhaust opening is determined to be equal to the interval between the substrates.

* * * * *